US008106705B2

(12) United States Patent
Negoi

(10) Patent No.: US 8,106,705 B2
(45) Date of Patent: Jan. 31, 2012

(54) CONTROL CIRCUIT FOR PVT CONDITIONS OF A MODULE

(75) Inventor: Andy C. Negoi, Crolles (FR)

(73) Assignee: Synopsys, Inc., Mountain View, CA (US)

( * ) Notice: Subject to any disclaimer, the term of this patent is extended or adjusted under 35 U.S.C. 154(b) by 379 days.

(21) Appl. No.: 12/299,726

(22) PCT Filed: May 2, 2007

(86) PCT No.: PCT/IB2007/051630
§ 371 (c)(1), (2), (4) Date: Nov. 5, 2008

(87) PCT Pub. No.: WO2007/129259
PCT Pub. Date: Nov. 15, 2007

(65) Prior Publication Data
US 2009/0189649 A1    Jul. 30, 2009

(30) Foreign Application Priority Data

May 5, 2006    (EP) ..................................... 06300442

(51) Int. Cl.
*G05F 1/567* (2006.01)
*G05F 3/08* (2006.01)
(52) U.S. Cl. ........................................ 327/538; 323/315
(58) Field of Classification Search .................. None
See application file for complete search history.

(56) References Cited

U.S. PATENT DOCUMENTS

| 6,380,758 | B1 | 4/2002 | Hsu et al. |
| 6,380,797 | B1 | 4/2002 | Macaluso et al. |
| 6,556,022 | B2 | 4/2003 | To et al. |
| 6,844,755 | B2 | 1/2005 | Ajit |
| 6,903,601 | B1 | 6/2005 | Aude |
| 7,427,158 | B2 * | 9/2008 | Yoshida ........................ 374/172 |
| 2003/0007681 | A1 | 1/2003 | Baker |
| 2005/0134364 | A1 | 6/2005 | Bhattacharya et al. |

(Continued)

FOREIGN PATENT DOCUMENTS

JP    61137421 A    6/1986

(Continued)

OTHER PUBLICATIONS

EPO, Communication pursuant to Article 94(3) EPC dated Sep. 21, 2009 for European patent application 07 735 730.9.

(Continued)

*Primary Examiner* — Lincoln Donovan
*Assistant Examiner* — Terry L Englund
(74) *Attorney, Agent, or Firm* — Fenwick & West LLP

(57) ABSTRACT

The electronic circuit comprises a functional module (10), a condition signaling module (20), a reference module (30) and a control circuit (40). The condition signaling module (20) generates an indication signal (Imeas) indicative for PVT conditions local to the functional module. The PVT conditions comprise a set of conditions relevant for a module comprising at least one of a voltage supplied to said module, a temperature within an area occupied by said module and the process conditions relevant for said area The reference module (30) generates a reference signal (Iref) having a value that is substantially independent of said PVT-conditions. The control circuit (40) compares the indication signal (Imeas) and the reference signal (Iref), and for generating a control signal (pvt<1>, . . . , pvt<n>) for the functional module.

19 Claims, 5 Drawing Sheets

U.S. PATENT DOCUMENTS

Figure 1:
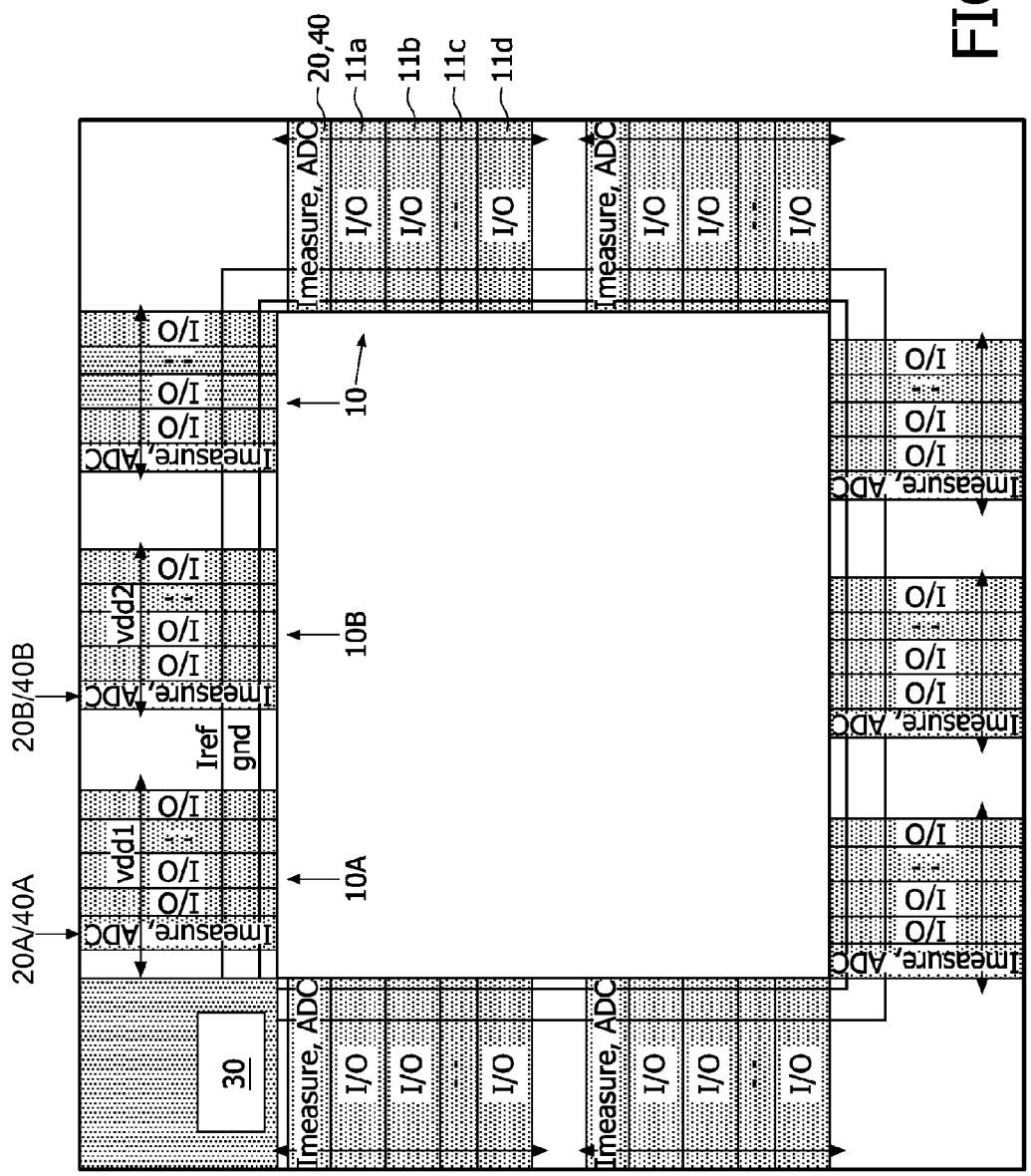

2009/0315532 A1 * 12/2009 Negoi et al. .................. 323/312

FOREIGN PATENT DOCUMENTS

| JP | 2001520824 T | 10/2001 |
| WO | WO 2007 042970 A1 | 4/2005 |
| WO | WO 2007 034384 A2 | 3/2007 |

OTHER PUBLICATIONS

EPO, Office communication Noting the loss of rights pursuant to Rule 112(1) EPC dated Aug. 3, 2010 for European patent application 07 735 730.9.

Japanese Patent Office, Office Action with English Office Action Summary dated Feb. 1, 2011 for application No. JP 2009-508604.

* cited by examiner

CONTROL CIRCUIT FOR PVT CONDITIONS OF A MODULE

Different parts of an integrated circuit may show a different performance depending on variations in process parameters over the IC area during the IC manufacturing process (process corner variations). Likewise performance may vary due to local variations in supply voltage and temperature. In particular said variations may affect the timing of the components involved. In particular for high-speed circuitry this either will cause malfunctioning, or the IC has to be designed to operate at a significantly lower speed, so as to take account for the worst case. A further complication is caused by the fact that in modern technologies an integrated circuit may have various interfaces that are supplied from different voltage domains (for example 3.3V, 2.5V, 1.8V, 1.2V I/O supply voltages can be used in a single integrated circuit).

U.S. Pat. No. 6,556,022 describes a method and apparatus that provides for a compensation of the consequences of said local parameter variation. In order to detect performance parameter variations at different locations, local parameter detectors are located at the various locations. One of the locations is selected as the reference location while the other locations are selected as destination locations. The reference location is utilized to determine a reference parameter value that is indicative for a value of said parameter at the reference location, while each destination location compares its local parameter value with the reference parameter value. The parameter values are current encoded and the reference parameter value is sent to the other locations for comparison. The comparison at the destination locations generates a corrective signal to compensate for the difference in the parameter value between the locations. Parameter compensation is provided to reduce performance skew among the distributed locations.

It is a disadvantage of the known device that a separate reference circuit has to be supplied for each voltage domain.

It is a purpose of the invention to provide an integrated circuit and a method wherein a single reference source suffices.

An apparatus and a method according to the invention in accordance therewith are claimed in claims 1 and 9 of the present application.

In the integrated circuit according to the invention the reference source supplies a reference signal having a value that is substantially independent of said PVT-conditions. It was recognized by the inventor, that in the known device each reference source only provides a reference signal that is suitable for circuit components operating in a same voltage domain. For circuitry operating in other voltage domains separate reference signals have to be generated. The reason therefore is that variations in the PVT conditions will cause different variations in the reference signal dependent on the voltage domain for which it is provided.

In the device and method according to the present invention a single reference source suffices.

Although the invention is useful for applications having a common supply voltage for the entire circuit, it is in particular suitable for application in an integrated circuit comprising a plurality of regions being supplied by a mutually different supply voltage and that each have a condition signaling module. In this case, each of the control circuits of those regions can use the reference signal provided by the same reference module. A single control circuit for each voltage region is sufficient. However, alternatively more than one control circuit may be present within each region.

Different supply voltages particularly occur in integrated circuits having various interfaces that use mutually different operating voltages. Accordingly the invention is particularly relevant in applications wherein the functional module is an I/O circuit.

In an embodiment the condition signaling module and the control circuit are combined with an ESD protection circuit in an I/O ring. This allows for achieving a relatively strong functionality in the same places, distributed along the circuit periphery, by combining two functionalities in the same area (ESD protection circuits and PVT compensation circuits).

It should be understood that although the wording integrated circuit is used throughout the description, the invention is also applicable to electronic circuits which are implemented in a cluster of integrated circuits, i.e. system in package comprising various integrated circuits in a shared package.

Figure 2:
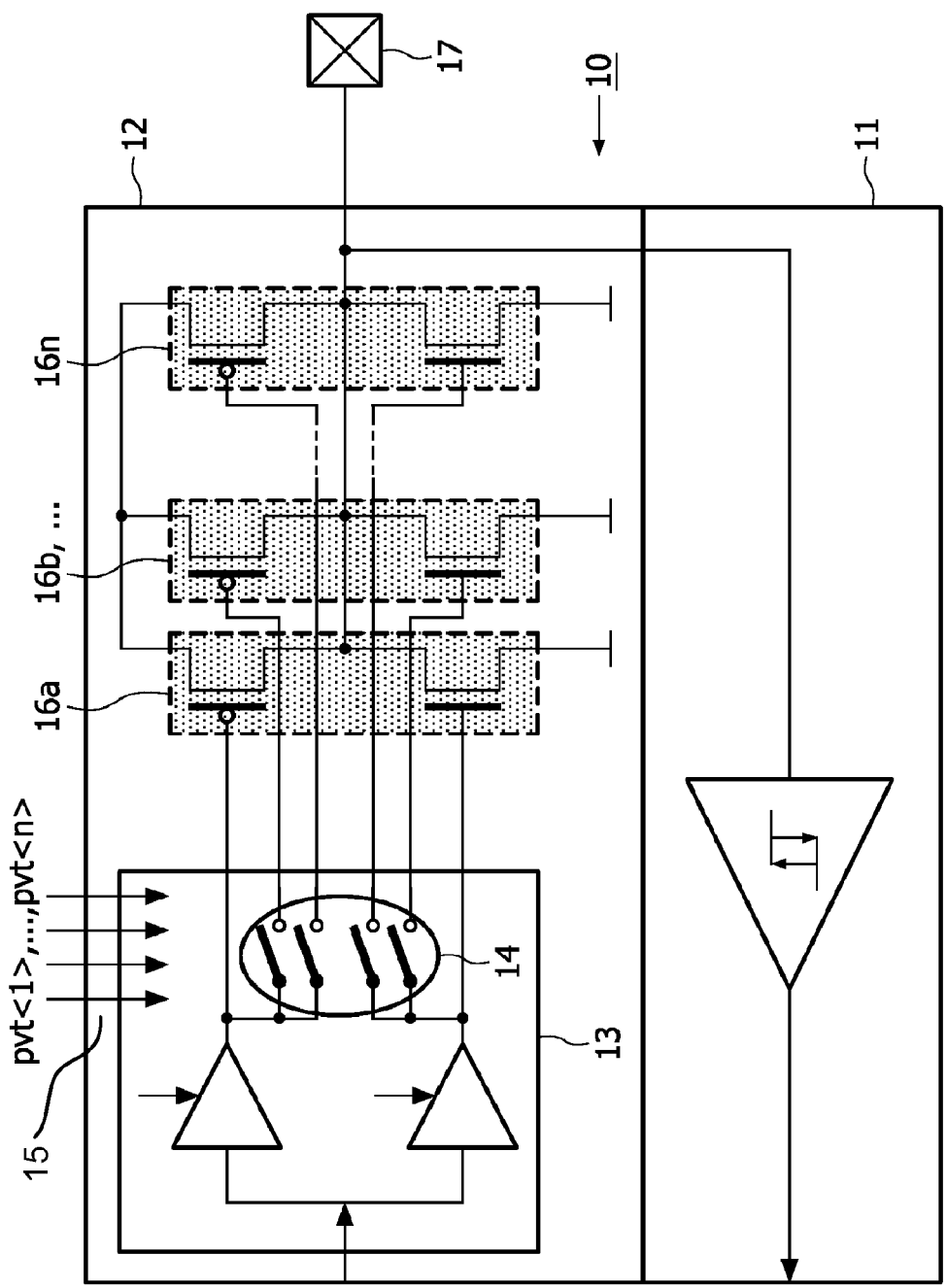
Figure 3:
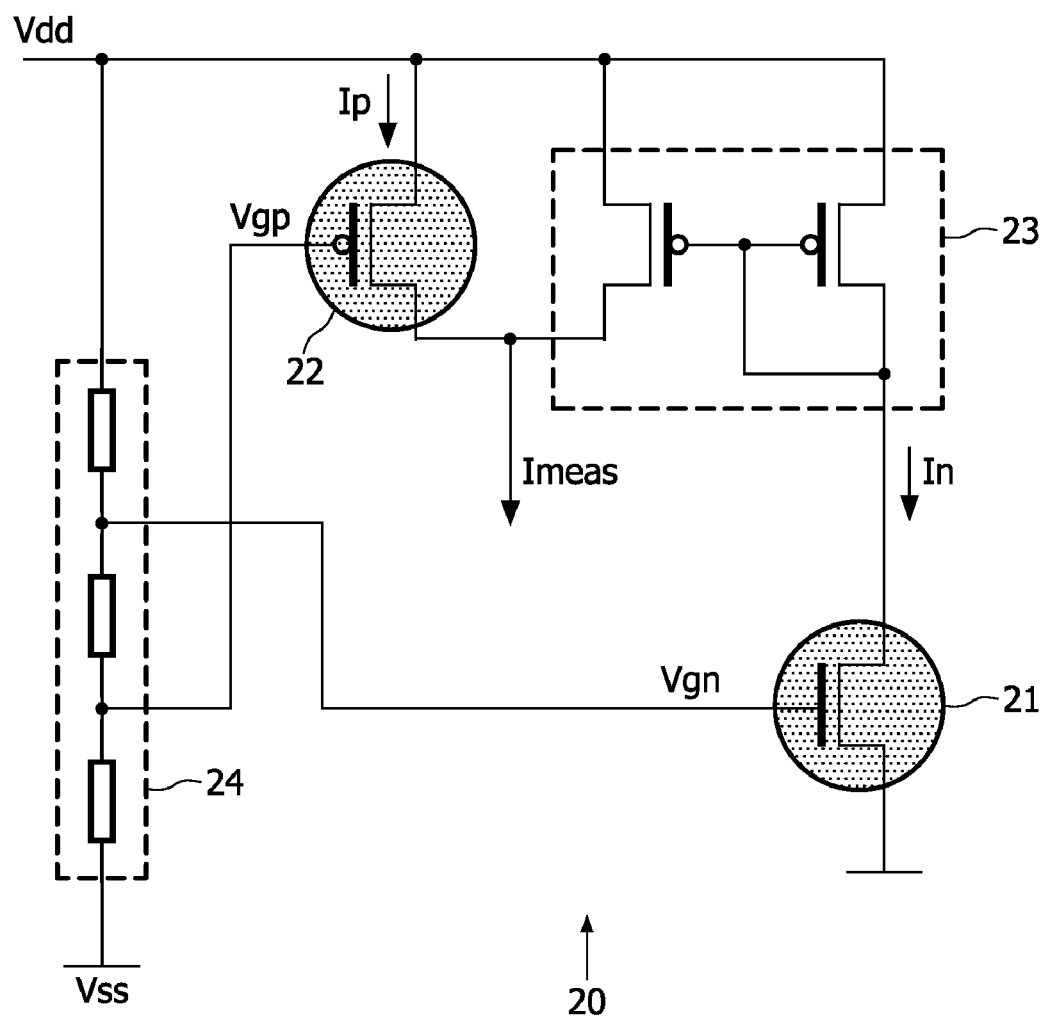
Figure 4:
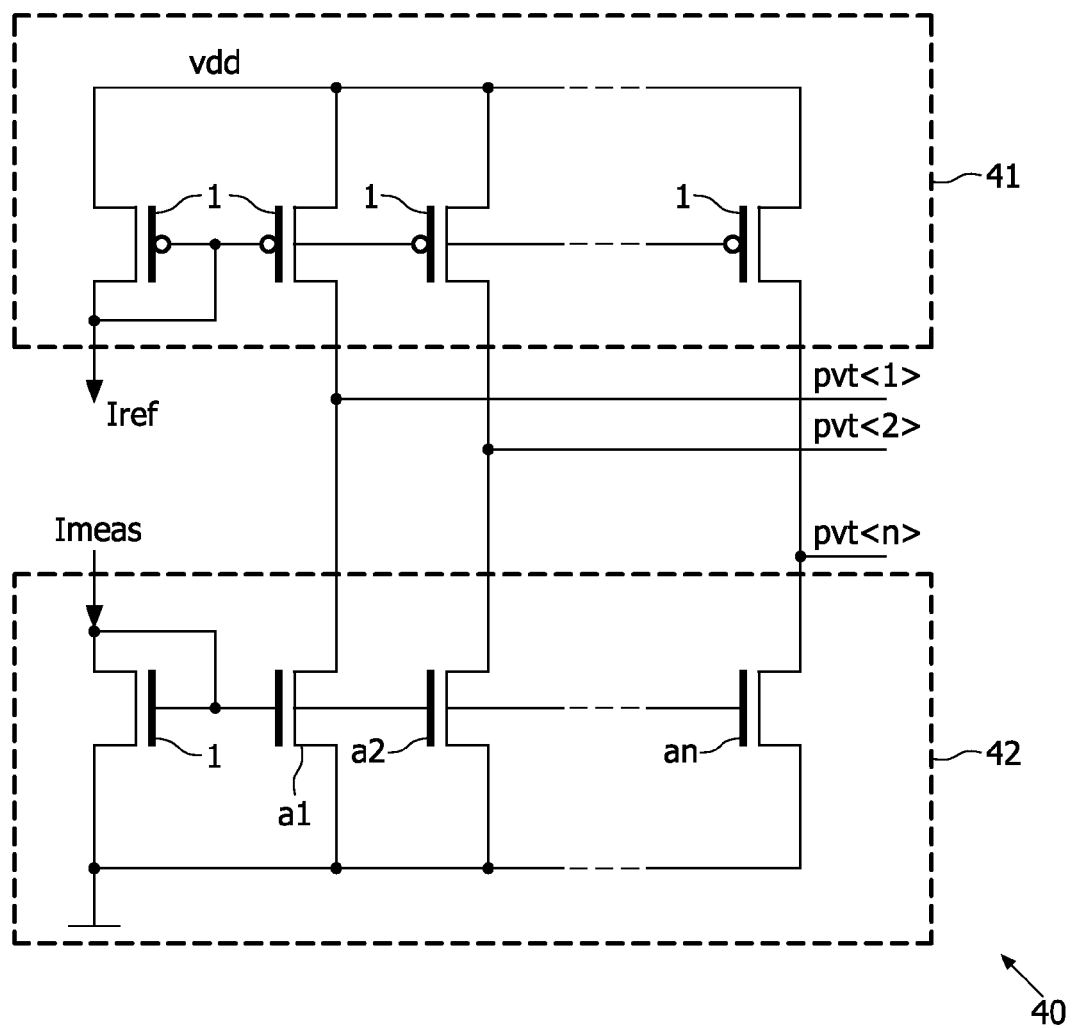
Figure 5:
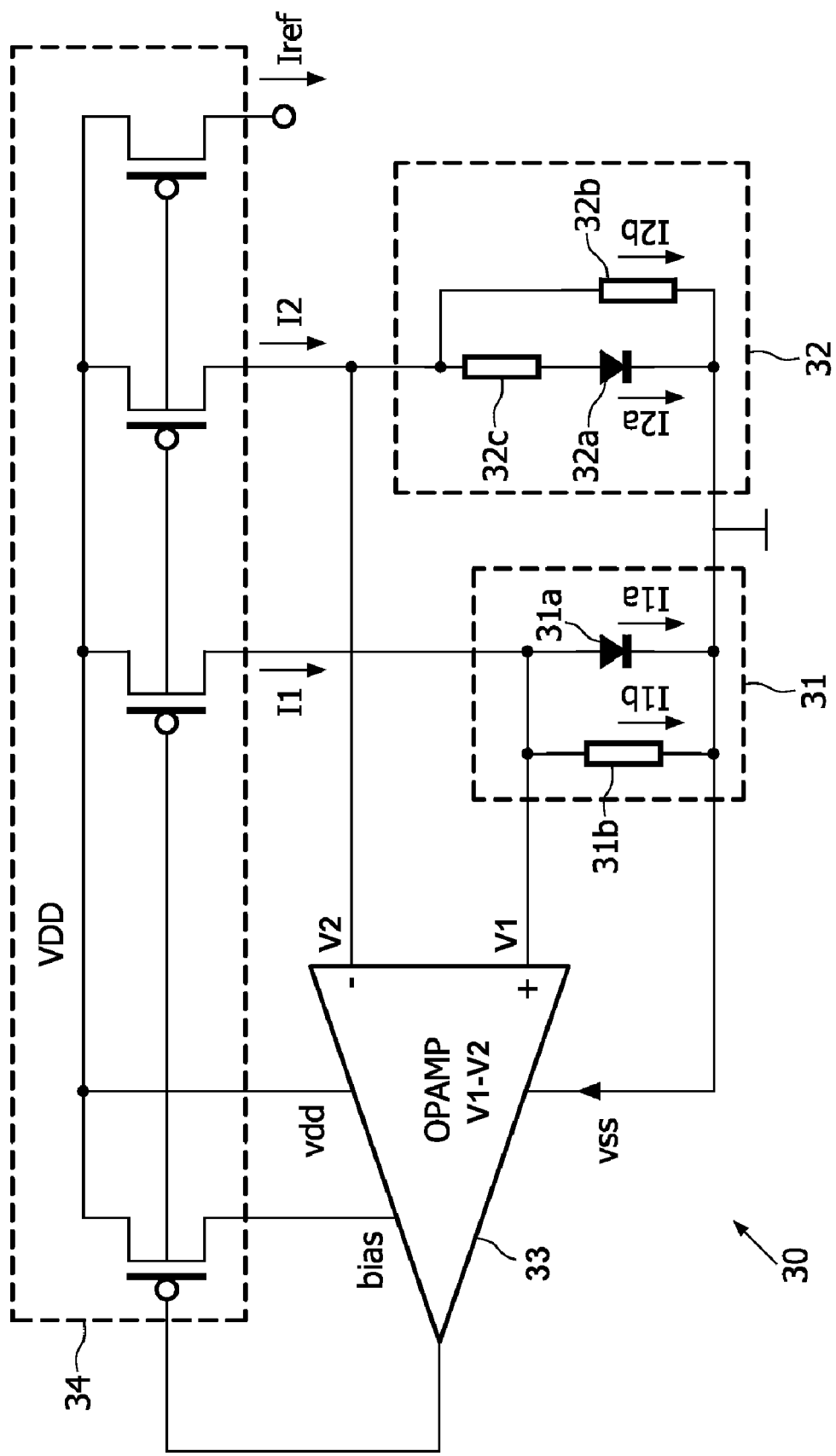

These and other aspects are described in more detail with reference to the drawing. Therein FIG. 1 schematically shows an integrated circuit according to the invention, FIG. 2 shows an example of a functional module used in the circuit of FIG. 1, FIG. 3 shows an example of a condition signaling module as used in the circuit of FIG. 1, FIG. 4 shows an example of a control circuit used in the circuit of FIG. 1, FIG. 5 shows an example of a reference module used in the circuit of FIG. 1.

FIG. 1 schematically shows an integrated circuit according to the invention. The integrated circuit comprises a plurality of functional modules 10. In the embodiment shown at least one thereof comprises a plurality of output modules 11a, . . . , 11d. Other functional modules comprise input modules, data-processing modules, and data storage modules. Local to the functional module the integrated circuit comprises a module 20 for generating an indication signal indicative for the local PVT conditions. The PVT conditions comprise a set of conditions relevant for a module including at least one of a voltage supplied to said module, a temperature within an area occupied by said module and the process conditions relevant for said area.

The integrated circuit comprises a reference module 30 for generating a reference signal having a value which is substantially independent of said PVT-conditions.

A control circuit 40 compares the indication signal and the reference signal, and generates a control signal for the functional module.

FIG. 2 shows in more detail an example of a functional module 10. In the example shown the functional module 10 is an I/O-module. The I/O module 10 comprises an input section 11 and an output section 12 coupled to an I/O-pad 17. The input section 11, for example, comprises a standard input buffer, and will not be described in detail here.

The output section comprises a pre-driver stage 13 and a plurality of output buffer sections 16a, . . . , 16n, that are controlled by the pre-driver stage. One of the output buffer sections 16a may be permanently active. The pre-driver stage 13 has a set of switches 14 for selectively activating the other output buffer sections 16b, . . . , 16n, depending on a PVT-code received at a control input 15. For example, in PVT-conditions where the output buffer section 16a only provides a relatively low output current one or more other output buffer sections may be activated to achieve a predetermined current to the I/O-tab 17. The number of output buffer sections may be selected in accordance with the range of conditions for which the circuit is designed to operate and with the required accuracy of operation. The output buffers 16a, . . . , 16n may be designed to provide a mutually substantial equal output current. Alternatively they may be designed to provide mutually different output currents. In an embodiment for example each subsequent output buffer is arranged for providing half the output current of its predecessor. The PVT-code used to control the pre-driver stage should be provided accordingly.

FIG. 3 shows in more detail a condition signaling module 20 for generating an indication signal Imeas indicative for PVT conditions local to the functional module 10. The condition signaling module comprises a first controllable current source 21 being of a first conductivity type, and providing a first current In depending on the local PVT-conditions, and a second controllable current source 22 being of a second conductivity type, and providing a second current Ip depending on the local PVT-conditions. The currents In and Ip are added, using a current mirror 23, providing the indication signal Imeas. In the embodiment shown, the controllable current sources 21 and 22 respectively are an NMOS and a PMOS transistor. It will however be clear to the skilled person that different types of current sources may be used, depending on the technology used. In an embodiment for example only devices are used of a single conductivity type, e.g. as described in the earlier filed European patent applications 05108653.6 and 05109354.0. In the embodiment shown in FIG. 3 control voltages Vgn and Vgp for the controllable current sources 21 and 22 are supplied by a voltage divider 24 coupled to the power supply lines Vdd and Vss. Alternatively, separate supply lines available on the IC may be used to control the controllable current sources 21,22.

FIG. 4 shows in more detail a control circuit 40 for comparing the indication signal Imeas and the reference signal Iref, and generating a control signal pvt<1>, . . . , pvt<n> for the functional module. The control circuit comprises a first and a second mutually complementary current mirror block 41 and 42. The first current mirror block 41 replicates the reference current Iref one or more times. The second current mirror block 42 provides replicates of the indication signal Imeas scaled with scaling factors a1, . . . , an. Each of the control signals pvt<1>, . . . , pvt<n> is a binary signal representative for the difference between a replication of the reference current Iref and a scaled replication of the indication signal Imeas. Dependent on the value of the indication signal Imeas, one or more of the control signals pvt<1>, . . . , pvt<n> will be asserted, resulting in a stronger or weaker compensation in the functional module 10. In this embodiment the control signal is represented digitally, e.g. as a set of one or more signal components that have one of a predetermined number of values. This provides for an arbitrarily accurate control of the functional module 10. Alternatively however, the control signal may be an analogue signal. This on its turn allows for a reasonably accurate compensation with only one or two signal lines.

FIG. 5 shows in more detail a reference module 30 for generating a reference signal Iref having a value which is substantially independent of said PVT-conditions. In particular the reference signal is a current. It was found that a current signal is most suitable in this case as it shows less deterioration at long distances between the reference module 30 and the functional module 10.

In the embodiment shown the reference module 30 has a first and a second PVT-condition sensitive element 31,32 providing a first and a second voltage V1,V2 as a function of said local PVT conditions and a provided current Iref. The condition sensitive elements 31, 32 have a mutually different dependency of their voltage on the PVT conditions, and the reference module has a comparison module 33 which controls a current source 34 for providing the current Iref in response to the difference in voltage V1-V2 between the temperature sensitive elements. The current source 34 also provides a copy of the current I1+I2 as the reference signal Iref.

In the embodiment shown the first condition sensitive element comprises a diode 31a coupled in parallel to a resistor 31b with value R2. The voltage over the diode 31a during operation decreases with temperature, e.g. with 2 mV/° C. A current I1 provided by the current source is divided into a first component I1a via the diode 31a and a second component I1b via the resistor 31b. The local PVT conditions determine how the current is divided. For example if the temperature T increases the fraction I1a of the current I1 conducted via the diode 31a will increase. The second condition sensitive element comprises a series arrangement of a diode 32a and series resistor 32c with value R1 coupled in parallel to a resistor 32b with value R2. Due to the series resistor 32c the component 12a conducted through said series arrangement is slightly smaller than would be the case in the absence of the series resistor 32c. The voltage over the series arrangement of diode 32a and resistor 32c also decreases with temperature, however to a lesser extent, as the voltage component over the series resistor 32c is increasing with the temperature. The currents through the elements 31a and 32a are proportional to the absolute temperature, while the voltages V1=V2 decrease with the temperature and thus the currents I1b and I2b also decrease with temperature. The sum I1+I2 is substantially independent of the process, temperature and supply voltage variations and represents the reference signal for PVT compensation of the functional modules 10. In a practical implementation the value R2 of the parallel resistors 31b, 32b is 500 kΩ and the value R1 of the series resistor 32c is 60 kΩ. In this practical implementation the diodes 31a, 32a have a width ratio of 1 to 8.

Referring back to FIG. 1, the integrated circuit shown therein comprises two or more regions that are supplied by mutually different supply voltages (Vdd1, Vdd2). The regions, wherein respectively a first and a second I/O page 10A, 10B are arranged, each comprise a condition signaling module 20A, 20B and a control circuit 40A, 40B. The control circuits 40A, 40B of those regions use the reference signal Iref provided by the same reference module 30.

In the preferred embodiment the reference module 30 is provided with the lowest available supply voltage. The integrated circuit may for example have different supply voltages for various I/O circuitry or other functional modules, e.g. 1.2V, 1.5V, 1.8V, 2.5V, 3.3V. In that case the preferred supply voltage for the reference module is 1.2V.

It is remarked that the scope of protection of the invention is not restricted to the embodiments described herein. Parts of the system may implemented in hardware, software or a combination thereof. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

The invention claimed is:
1. An electronic circuit comprising:
(A) a plurality of regions; and
(B) a reference module for generating a reference signal having a value which is substantially independent of PVT conditions local to the plurality of regions, wherein each respective region in the plurality of regions is supplied by a corresponding mutually different supply voltage and wherein each respective region in the plurality of regions comprises:
  (i) a corresponding functional module;
  (ii) a corresponding condition signaling module for generating a corresponding indication signal indicative for PVT conditions local to the corresponding functional module, said PVT conditions comprising a set of conditions relevant for the corresponding functional module comprising at least one of said corresponding mutually different supply voltage supplied to said corresponding functional module, a temperature within a corresponding area occupied by said corresponding functional module and the process conditions relevant for said corresponding area; and
  (iii) a corresponding control circuit for comparing the corresponding indication signal and the reference signal, and for generating a corresponding control signal for the corresponding functional module.

2. The electronic circuit of claim 1, wherein the reference module is provided with a lowest available supply voltage.

3. The electronic circuit of claim 1, wherein
the reference module has first and second PVT-condition sensitive elements for providing first and second voltages as a function of PVT conditions local to the reference module and first and second provided currents, wherein the PVT-condition sensitive elements have a mutually different dependency of their voltage on said PVT conditions local to the reference module, and the reference module further has a difference amplifier module which controls a current source for providing the currents in order to minimize a difference between the first and second voltages provided by first and second temperature sensitive elements, the current source providing an output current that is a sum of the first and second provided related to the currents as the reference signal.

4. The electronic circuit of claim 1, wherein the corresponding functional module in the respective region in the plurality of regions is an I/O circuit.

5. The electronic circuit of claim 1, wherein the corresponding condition signaling module and the corresponding control circuit in the respective region in the plurality of regions are combined with an ESD protection circuit in an I/O ring.

6. The electronic circuit of claim 1, wherein the corresponding control signal in the respective region in the plurality of regions is represented digitally.

7. The electronic circuit of claim 1, wherein the reference signal is a current value.

8. A method comprising:
  generating, for each respective functional module in a plurality of functional modules, a respective indication signal indicative for PVT conditions local to the respective functional module, said PVT conditions local to the respective functional module denoting a set of conditions relevant for the respective functional module comprising at least one of a voltage supplied to said respective functional module, a temperature within a corresponding area occupied by said respective functional module and the process conditions relevant for said corresponding area;
  generating a single reference signal having a value which is substantially independent of said PVT conditions of each respective functional module; and
  comparing, for each res ective functional module in the plurality of functional modules, the respective indication signal of the respective functional module and the single reference signal and thereby generating a corresponding control signal for the respective functional module,
  wherein each respective functional module in the plurality of functional modules occupies a respective region in a plurality of regions of an electronic circuit.

9. The method of claim 8, wherein the single reference signal is generated using a lowest available supply voltage to the electronic circuit.

10. The method of claim 8, wherein the single reference signal is generated by a reference module having first and second PVT-condition sensitive elements for providing first and second voltages as a function of PVT conditions local to the reference module and first and second provided currents, wherein the PVT-condition sensitive elements have a mutually different dependency of their voltage on said PVT conditions local to the reference module, and the reference module further has a difference amplifier module which controls a current source for providing the currents in order to minimize a difference between the first and second voltages provided by first and second temperature sensitive elements, the current source providing an output current that is a sum of the first and second provided currents as the reference signal.

11. The method claim 8, wherein each of the respective functional modules in the plurality of functional modules is an I/O circuit.

12. The method claim 8, wherein the corresponding control signal for the respective functional module is represented digitally.

13. The method of claim 8, wherein the reference signal is a current value.

14. An electronic circuit comprising:
  (A) a plurality of regions; and
  (B) means for generating a reference signal having a value which is substantially independent of PVT conditions local to the plurality of regions,
  wherein each respective region in the plurality of regions is supplied by a corresponding mutually different supply voltage and wherein each respective region in the plurality of regions comprises:
    (i) a corresponding functional module;
    (ii) a corresponding condition signaling means for generating a corresponding indication signal indicative for PVT conditions local to the corresponding functional module, said PVT conditions comprising a set of conditions relevant for the corresponding functional module comprising at least one of said corresponding mutually different supply voltage supplied to said corresponding functional module, a temperature within a corresponding area occupied by said corresponding functional module and process conditions relevant for said corresponding area; and
    (iii) a corresponding control means for comparing the corresponding indication signal and the reference signal, and for generating a corresponding control signal for the corresponding functional module.

15. The electronic circuit of claim 14, wherein the means for generating a reference signal is provided with a lowest available supply voltage to the electronic circuit.

16. The electronic circuit of claim 14, wherein
the means for generating a reference signal has first and second PVT-condition sensitive elements for providing first and second voltages as a function of PVT conditions local to the means for generating a reference signal and first and second provided currents, wherein the PVT-condition sensitive elements have a mutually different dependency of their voltage on said PVT conditions local to the means for generating a reference signal, and the means for generating a reference signal further has a difference amplifier module which controls a current source for providing the currents in order to minimize a difference between the first and second voltages provided by first and second temperature sensitive elements, the current source providing an output current that is a sum of the first and second provided currents as the reference signal.

17. The electronic circuit of claim 14, wherein the corresponding functional module in the plurality of regions is an I/O circuit.

18. The electronic circuit of claim 14, wherein the corresponding control signal of the corresponding region in the plurality of regions is represented digitally.

19. The electronic circuit of claim 14, wherein the reference signal is a current value.

* * * * *

UNITED STATES PATENT AND TRADEMARK OFFICE
CERTIFICATE OF CORRECTION

PATENT NO.         : 8,106,705 B2
APPLICATION NO.    : 12/299726
DATED              : January 31, 2012
INVENTOR(S)        : Andy C. Negoi It is certified that error appears in the above-identified patent and that said Letters Patent is hereby corrected as shown below:

In claim 3, column 5, line 38, delete "related to the" between "provided" and "currents".

In claim 6, column 5, line 49, replace "in the respective" after "signal" with "in a".

In claim 8, column 6, line 1, replace "res ective" after "each" with "respective".

In claim 8, column 6, line 4, remove "and" between "signal" and "thereby".

Signed and Sealed this
Twelfth Day of June, 2012

David J. Kappos
*Director of the United States Patent and Trademark Office*